United States Patent
Oshida et al.

(10) Patent No.: US 7,897,475 B2
(45) Date of Patent: Mar. 1, 2011

(54) SEMICONDUCTOR DEVICE HAVING PROJECTION ON LOWER ELECTRODE AND METHOD FOR FORMING THE SAME

(75) Inventors: Daisuke Oshida, Kanagawa (JP); Toshiyuki Takewaki, Kanagawa (JP); Takuji Onuma, Kanagawa (JP); Koichi Ohto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 412 days.

(21) Appl. No.: 12/073,545

(22) Filed: Mar. 6, 2008

(65) Prior Publication Data

US 2008/0237793 A1 Oct. 2, 2008

(30) Foreign Application Priority Data

Mar. 28, 2007 (JP) .............................. 2007-085145

(51) Int. Cl.
*H01L 21/20* (2006.01)
(52) U.S. Cl. .................. 438/398; 438/393; 438/396; 438/399; 257/E21.09
(58) Field of Classification Search .................. 438/398, 438/399; 257/E21.09
See application file for complete search history.

(56) References Cited

U.S. PATENT DOCUMENTS

| | | | |
|---|---|---|---|
| 5,866,455 A * | 2/1999 | Wu | 438/255 |
| 6,090,655 A * | 7/2000 | Zahurak et al. | 438/239 |
| 6,329,264 B1 * | 12/2001 | Wu | 438/398 |
| 6,440,795 B1 * | 8/2002 | Harshfield | 438/255 |
| 6,548,351 B2 * | 4/2003 | Hwang | 438/255 |
| 6,890,818 B2 * | 5/2005 | Zheng et al. | 438/255 |
| 6,902,985 B2 * | 6/2005 | Derderian et al. | 438/398 |
| 7,274,059 B2 * | 9/2007 | Pontoh et al. | 257/296 |
| 2002/0036312 A1 * | 3/2002 | Bertagnolli et al. | 257/306 |
| 2005/0124113 A1 | 6/2005 | Yoneda | |
| 2005/0130326 A1 * | 6/2005 | Lee et al. | 438/3 |

FOREIGN PATENT DOCUMENTS

| | | |
|---|---|---|
| JP | 2001-196562 | 7/2001 |
| JP | 2002-134719 | 5/2002 |
| JP | 2005-150228 | 6/2005 |

* cited by examiner

*Primary Examiner*—Angel Roman
(74) *Attorney, Agent, or Firm*—McGinn IP Law Group, PLLC

(57) ABSTRACT

A method of forming a semiconductor device, includes forming a lower electrode including a metal and a nitrogen on a semiconductor substrate, irradiating a reducing gas to a surface of the lower electrode, and irradiating a gas containing silicon to the surface of the lower electrode to form a projection containing silicide by reacting the metal with the silicon in an island shape on the surface of the lower electrode. Then, a capacitor film is formed on the lower electrode and the projection, and an upper electrode is formed on the capacitor film.

11 Claims, 5 Drawing Sheets

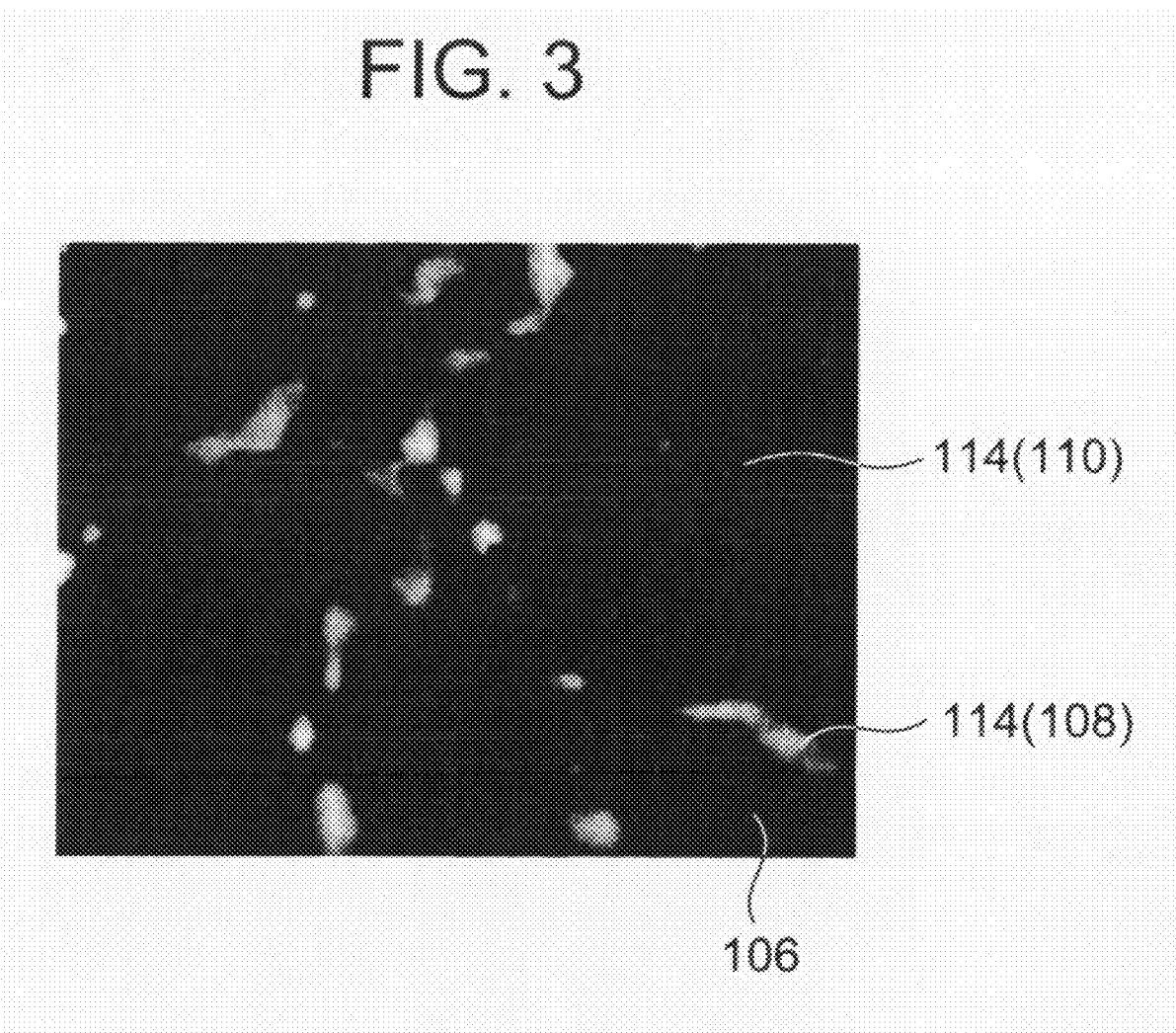

SEMICONDUCTOR DEVICE HAVING PROJECTION ON LOWER ELECTRODE AND METHOD FOR FORMING THE SAME

BACKGROUND OF THE INVENTION

1. Field of the Invention

The present invention relates to a semiconductor device and a method of forming the same, in particular to a Metal-Insulator-Metal Capacitor.

2. Description of Related Art

Conventionally, capacitive elements constituted by a lower electrode, a capacitor film, and an upper electrode have the following types: MIS type (Metal-Insulator-Semiconductor) and SIS type (Silicon-Insulator-Silicon) that use semiconductor as a material of a lower electrode, and MIM type (Metal-Insulator-Metal) that use metal as a material of a lower electrode. Recently, the development of MIM type capacitive elements has been pushed forward to achieve low resistance and an increase in capacity density.

In Patent Document 1 (Japanese Patent Application Laid-Open No. 2005-150228 A), technology is described that when semiconductor is used as a material of a lower electrode, expands the surface area of the lower electrode by making the surface uneven or putting it into HSG (Hemispherical Grain).

In Patent Document 2 (Japanese Patent Application Laid-Open No. 2001-196562 A), technology is described that after forming an oxidization layer on a lower electrode constituted by an amorphous silicon film, forms HSG on the surface of the oxidization layer. The oxidation layer suppresses the growth of crystalline nuclei that exist in the lower electrode, and functions as a barrier film for not consuming the lower electrode during formation of HSG.

In Patent Document 3 (Japanese Patent Application Laid Open No. 2002-134719 A), the following technology is described. That is, an amorphous silicon film is formed on an insulating film, and then the amorphous silicon film is changed by HSG processing to increase grain size; thereby, semi-spherical silicon crystal grains separated in an island shape are formed. With the semi-spherical silicon crystal grains as a mask, the insulating film is etched to form grooves in it. By forming the lower electrode on such a face having projections and depressions, the surface area of the lower electrode is increased.

However, with the conventional HSG technology described in Patent Document 1, the lower electrode is formed with a silicon film, and semi-spherical silicon crystal grains are formed by changing the silicon film. Therefore, this technology cannot apply to MIM type capacitive elements that use metal as a material of the lower electrode. The Patent Documents 2 and 3 also disclose using a silicon film as the lower electrode. With the technology described in Patent Document 2, since an oxide film is formed over the lower electrode and HSG is formed further on top of it, resistance cannot be brought low and the merit of the MIM type capacitive elements is reduced. The method described in Patent Document 3 requires additional processes such as the growth of an amorphous silicon film, HSG processing, and etching, resulting in a cumbersome procedure.

SUMMARY OF THE INVENTION

A method of forming a semiconductor device, includes forming a lower electrode including a metal and a nitrogen on a semiconductor substrate, irradiating a reducing gas to the surface of the lower electrode, and irradiating a gas containing silicon to the surface of the lower electrode to form a projection containing silicide, by reacting the metal with the silicon in an island shape on the surface of the lower electrode. Then, a capacitor film is formed on the lower electrode and the projection and an upper electrode is formed on the capacitor film.

A semiconductor device includes an insulating film formed on a semiconductor substrate, a lower electrode containing a metal and nitrogen, formed on the insulating film, a silicide projection formed on a portion of the lower electrode, a capacitor film formed on the lower electrode and the silicide projection, and an upper electrode formed on the capacitor film.

The inventors found out a MIM type capacitor element constituted by a lower electrode containing a metal applicable to a silicide and nitrogen, as below. The first is that there are regions in which the metal is partially un-nitridedd silicide and exposed on the surface of the lower electrode. The second is that silicon-containing crystal grains can be selectively formed in the regions. The third is that alloy projections can be formed by alloying the silicon-containing crystal grains with the metal. As the metal, Ti, W, Ta, Zr, Ga, or the like can be used. The lower electrode can be formed with TiN, WN, TaN, ZrN, GaN, or the like as a main component. The term "main component" means containing a metal to form partially un-nitridedd silicide in addition to nitrides. Ti, W, Ta, Zr, Ga, or the like are susceptible to oxidation, and an oxide if not processed. However, after irradiating a reducing gas to them for reduction, by irradiating a gas containing silicon such as $SiH_4$, silicon-containing crystal grains can be formed in that region.

By this construction, projections constructed by alloy on the surface of the lower electrode are formed in an island shape, so that the surface of the lower electrode has projections and depressions. As a result, the contact surface between the lower electrode and the capacitor film has projections and depressions. Thereby, the surface area between the electrode and the capacitor film can be widened, and capacitance values of the capacitive element can be increased. Furthermore, the projections and depressions may be reflected on the upper surface of the capacitor film, so that the contact surface between the capacitor film and the upper electrode can have projections and depressions. Thereby, the surface area between the electrode and the capacitor film can be widened, and capacitance values of the capacitive element can be increased. Moreover, since the projections are alloyed, the formation of the projections suppresses a rise in resistance value of the lower electrode, and the merit of using the MIM type capacitive element can be maintained.

According to the present invention, in a MIM type capacitive element, the surface area between an electrode and a capacitor film can be widened to improve capacitance values.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 3 is a drawing showing a state of the surface of a lower electrode manufactured in a procedure for manufacturing a semiconductor device described with reference to FIGS. 1 and 2.

DETAILED DESCRIPTION OF THE EXEMPLARY EMBODIMENTS

Figure 1:
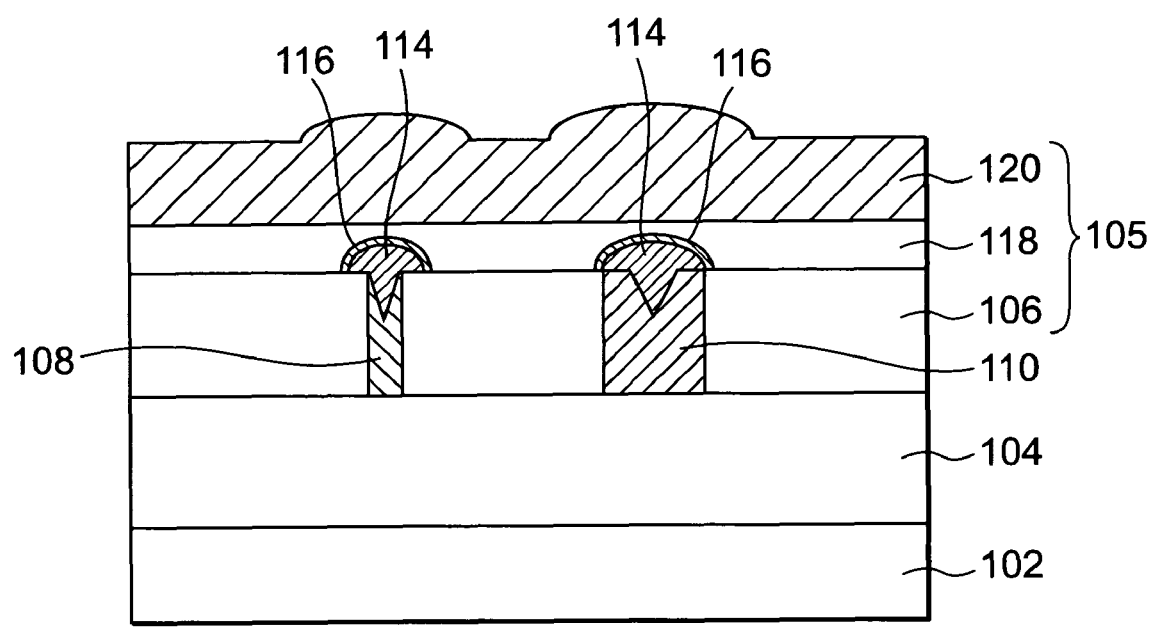
FIG. 1 is a sectional view showing the construction of a semiconductor device in the present invention.

FIG. 1 is a sectional view showing the construction of a semiconductor device 100 in this embodiment.

The semiconductor device 100 includes a semiconductor substrate 102 such as a silicon substrate, an insulating film 104 formed over the semiconductor substrate 102, and a capacitive element 105 formed over the insulating film 104. The insulating film 104 is provided via another insulating film (e.g., an insulating film in which a contact plug, lower layer wirings, and the like are embedded) over the semiconductor substrate 102. Elements (not shown) such as transistors are formed over the semiconductor substrate 102. In this embodiment, the capacitive element 105 is a MIM type capacitive element.

The capacitive element 105 includes a lower electrode 106 provided over the insulating film 104, a capacitor film 118 provided over the lower electrode 106, and an upper electrode 120 provided over the capacitor film 118.

In this embodiment, the lower electrode 106 can be formed by metal forming silicide and a conductive material including nitrogen. The lower electrode 106 can be formed by using, for example, TiN, WN, TaN, ZrN or GaN as main components. In this embodiment, the lower electrode 106 is formed with titanium nitride (TiN) as a main component. Using titanium nitride as a main component means containing partially un-nitrided Ti, in addition to titanium nitride. The lower electrode 106 includes a grain boundary 108 of titanium nitride and an un-nitrided region 110 being partially un-nitrided Ti. The un-nitrided Ti also segregates in the grain boundary 108. In a plane view, the ratio of a region formed by the un-nitrided Ti to the surface area of the lower electrode 106 can be defined as, for example, approximately from 5 to 30%. Forming the lower electrode with WN, TaN, ZrN, or GaN as a main component is equivalent to forming it with TiN as a main component.

In this embodiment, on the surface of the lower electrode 106, alloy projections 114 (projections containing silicide) formed by alloy containing Ti and Si is formed. Since the alloy projections 114 are formed in this embodiment, the surface of the lower electrode 106 has projections and depressions. The alloy projections 114 are formed over regions where the grain boundary 108 and the un-nitrided region 110 are exposed to the surface. Specifically, in a plane view, the ratio of the region in which the alloy projection 114 is formed to the surface area of the lower electrode 106 reflects the ratio of the region in which the un-nitrided Ti is formed, for example, approximately from 5 to 30%. Making the ratio of the formation of the alloy projection 114 approximately five percent or more provides the effect of widening the surface area between the electrode and the capacitor film and increasing a capacitance value. Making the ratio of the formation of the alloy projection 114 approximately 30 percent or less can prevent an increase in resistance value when a via connected with the lower electrode 106 is formed, as described later.

As materials of the capacitor film 118, for example, silicon nitride film, ZrO, TaO, or ZrTaO can be used. The capacitor film 118 can be disposed by the CVD (Chemical Vapor Deposition) method, reactive sputtering, or the like. The upper electrode 120 can be formed by, for example, Ti, Cu, W, Ta, Al, Ag or these alloys. The upper electrode 120 may be formed by the same materials as or materials different from those of the lower electrode 106.

The thickness of the lower electrode 106, the capacitor film 118, and the upper electrode 120 is, for example, 150 to 300 nm, 10 to 20 nm, and 100 to 200 nm, respectively. The capacitor film 118 is formed over the lower electrode 106 partially via the alloy projection 114. Therefore, the contact surface between the lower electrode 106 and the capacitor film 118 has projections and depressions. The projection and depression shape is reflected in the upper surface of the capacitor film 118, and the contact surface between the capacitor film 118 and the upper electrode 120 also has projections and depressions. Furthermore, the shape of the alloy projections 114 may be reflected in the upper electrode 120.

In this embodiment, dense films 116 are formed in contact faces between the alloy projections 114 and the capacitor film 118. The dense films 116 are insulating films formed by reaction between constituent materials of the capacitor film 118 and Si contained in the alloy projections 114 when the capacitor film 118 is formed over the lower electrode 106. In this embodiment, the capacitor film 118 may be a silicon nitride film. In this case, the dense films 116 also become silicon nitride films. The dense films 116 are formed by irradiating $NH_3$ gas to the surface of the alloy projections 114 under high temperature and plasma atmosphere, and causing reaction between the alloy projections 114 and $NH_3$ gas. Therefore, they are more densely formed than the capacitor film 118, which is later formed by the CVD method. By providing the dense films 116 in contact with the capacitor film 118, since dense, high-capacity films can be formed, the capacity value of the capacitor film 118 can be increased. The diffusion of metal from the alloy projections 114 to the capacitor film 118 can be prevented.

With reference to FIGS. 2A to 2G, the following describes a procedure for manufacturing the semiconductor device 100 in this embodiment.

Figure 2A:
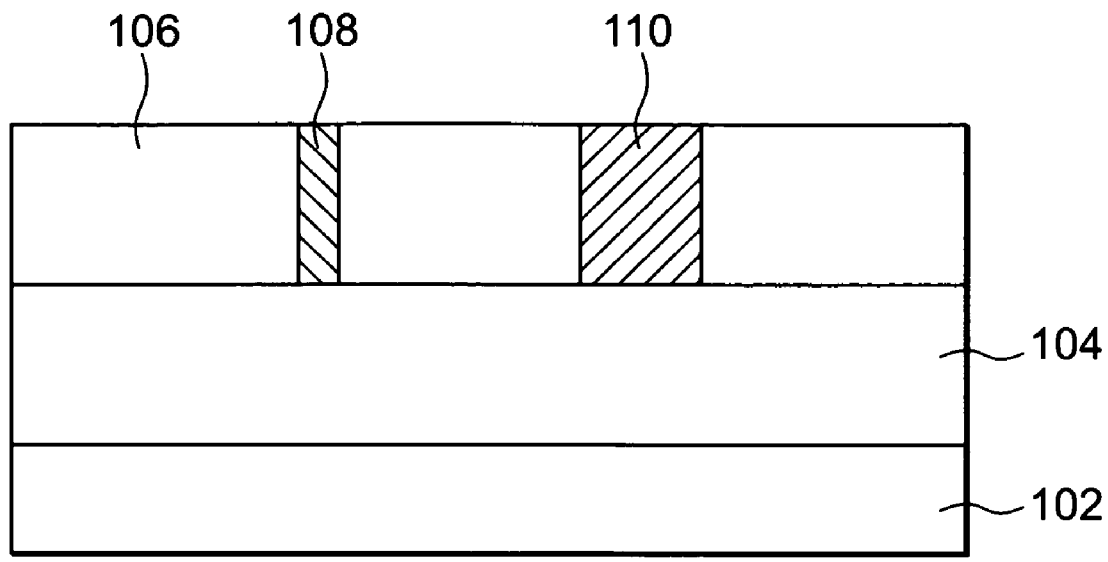
FIGS. 2A to 2G are process sectional views showing a procedure for manufacturing a semiconductor device in an embodiment of the present invention.

The insulating film 104 is formed by the CVD method over a semiconductor substrate 102 including transistors, resistance elements, and the like. The insulating film 104 may be a silicon dioxide film. Then, the lower electrode 106 formed with titanium nitride as a main component is formed by sputtering over the insulating film 104 (FIG. 2A). The ratio of a grain boundary on the surface of the lower electrode 106 can be controlled by controlling temperature and total gas pressure during sputtering of the lower electrode 106. Thereby, in a plane view, the ratio of a formed region of the un-nitrided Ti to the surface area of the lower electrode 106 can be set, for example, approximately from substantially 5 to substantially 30%.

Figure 2B:
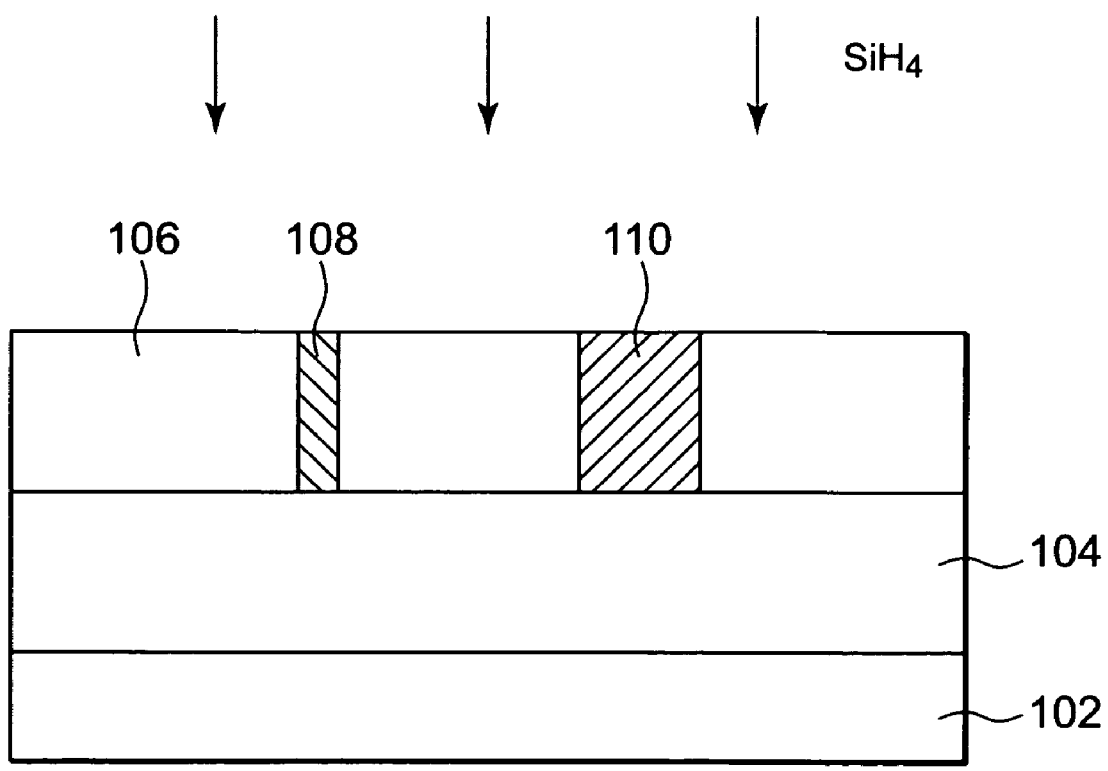

Next, reducing gas is irradiated to the surface of the lower electrode 106 (FIG. 2B). $NH_3$ gas, $H_2$ gas, or the like can be used as the reducing gas. Oxide formed on the surface of the lower electrode 106 can be eliminated by irradiating a reducing gas to the surface of the lower electrode 106. Particularly, un-nitrided Ti is susceptible to oxidation, and oxides are easily formed. However, by this processing, un-nitrided Ti can be exposed to the surface of the lower electrode 106. Thereby, in the next process, silicon-containing crystal grains 112 can be selectively formed in the region in which un-nitrided Ti is formed.

Figure 2C:
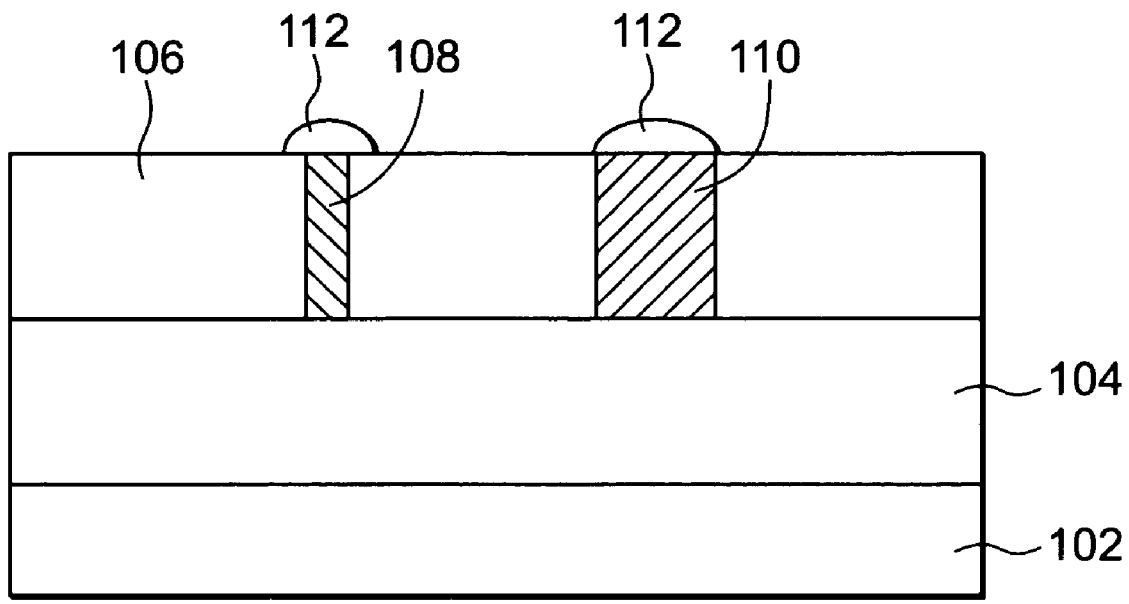

After irradiating a reducing gas to 106 surfaces of the lower electrode, $SiH_4$ is irradiated as a gas containing silicon to the surface of the lower electrode 106. As a result, the silicon-containing crystal grains 112 are formed on the surface of the lower electrode 106 (FIG. 2C). The silicon-containing crystal grains 112 are selectively formed in regions in which the grain boundary 108 and the un-nitrided region 110 are exposed, on the surface of the lower electrode 106. That is, the silicon-containing crystal grains 112 are formed in an island shape on the surface of the lower electrode 106.

Figure 2D:
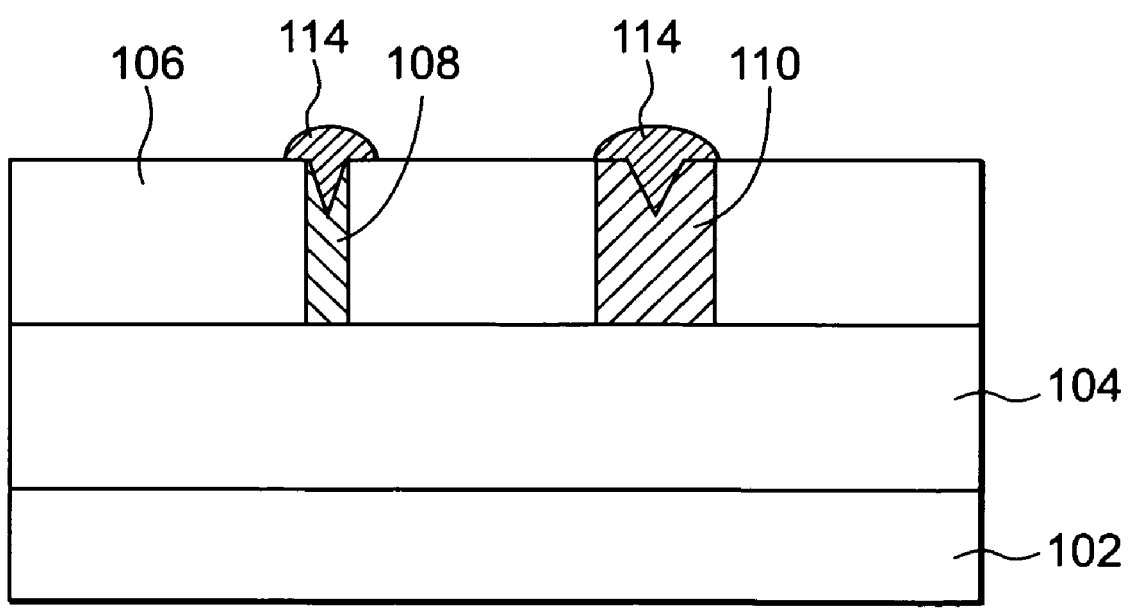

Then, annealing is performed. Thereby, reaction occurs between silicon in the silicon-containing crystal grains 112 and titanium in the silicon-containing crystal grains 112, the silicon-containing crystal grains 112 is alloyed, and the alloy projections 114 are formed in an island shape (FIG. 2D).

Figure 2E:
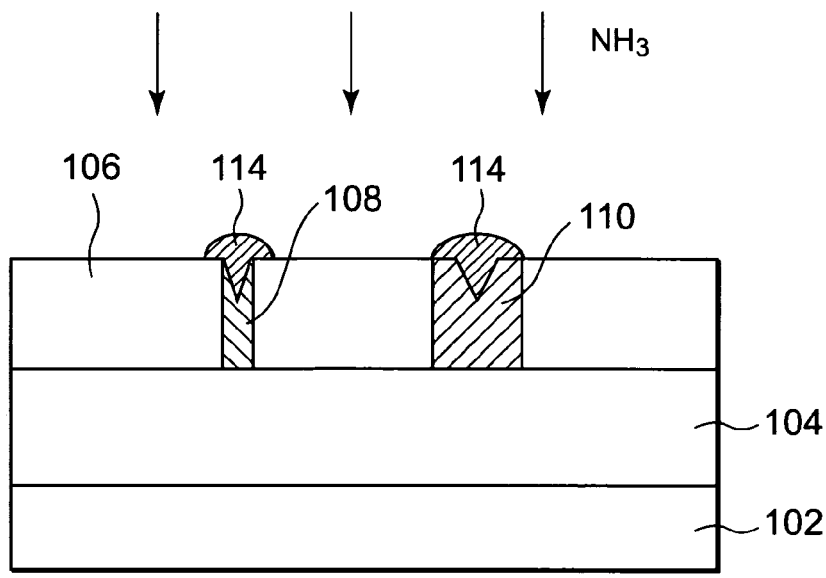
Figure 2F:
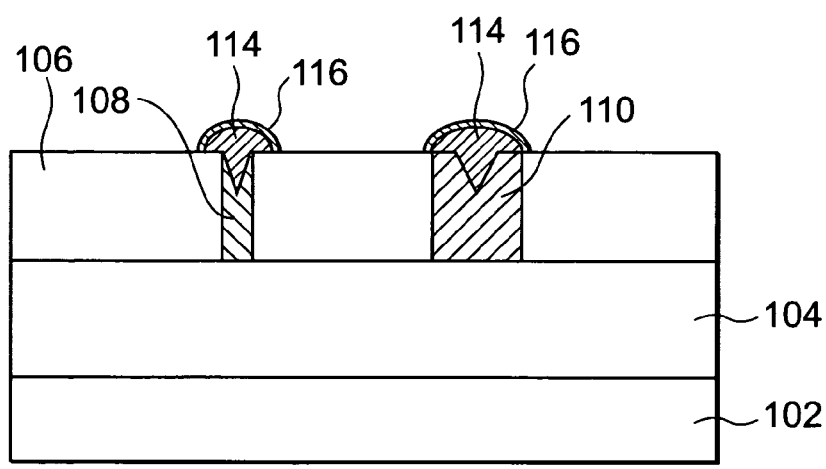

Next, the capacitor film 118 is formed by the CVD method over the lower electrode 106 and the alloy projections 114. In this embodiment, as film forming gases, a silicon-containing gas such as $SiCl_4$ gas, and an $NH_3$ gas are used. In this embodiment, an $NH_3$ gas is irradiated to the surface of the lower electrode 106 under high temperature (FIG. 2E). Thereby, the surface of the alloy projections 114 is nitrided, and the dense films 116 being silicon nitride films are formed on the surface of the alloy projections 114 (FIG. 2F). At this time, Ti—Si—N alloy is formed in the interface where the alloy projections 114 contact with the dense films 116.

Figure 2G:
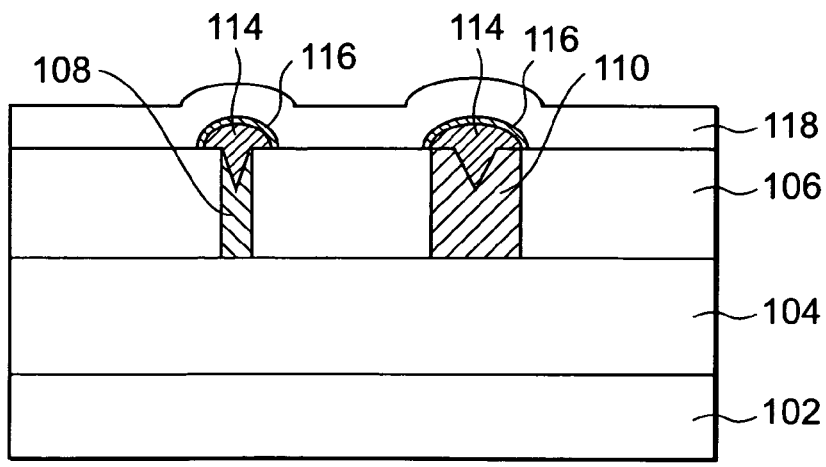

After that, the capacitor film 118 is formed by irradiating a silicon-containing gas in addition to the $NH_3$ gas (FIG. 2G). When a film containing oxygen such as ZrO, TaO, and ZrTaO is used as the capacitor film 118, the dense films 116 being silicon dioxide films can be formed by irradiating an oxygen gas in addition to the $NH_3$ gas.

After that, the upper electrode 120 with titanium nitride as a main component is formed on the capacitor film 118 by sputtering. Thereby, the capacitive element 105 is formed, and the semiconductor device as shown in FIG. 1 is formed.

The following describes some exemplary effects of this embodiment.

In this embodiment, the alloy projections 114 are formed in an island shape on the surface of the lower electrode 106, and the surface of the lower electrode 106 has projections and depressions. The projections and depressions are reflected in the capacitor film 118 and the upper electrode 120. Therefore, the surface area between the electrode and the capacitor film can be widened, and capacitance values of the capacitive element 105 can be increased. Since the alloy projections 114 constituted of alloy containing Ti and Si are formed on the surface of the lower electrode 106, even when the lower electrode 106 is formed with titanium nitride as a main component, the dense films 116 can be formed between the lower electrode 106 and the capacitor film 118. Thereby, capacitance values of the capacitive element 105 can further be increased.

The alloy projections 114 are disposed dispersedly in an island shape on the surface of the lower electrode 106. Therefore, when via holes are formed in the capacitor film 118, a region with TiN as a main component and a region with the alloy projections 114 as main components are likely to be exposed to the via hole bottom. If only the alloy projections 114 are exposed to the via hole bottom, then since silicon is susceptible to oxidation, a conductive material is embedded in the via hole, and when a via connected with the lower electrode 106 is formed, the via is connected with the lower electrode 106 via an oxidized portion, and resistance values may rise. According to semiconductor device 100 in this embodiment, since a region with TiN as a main component and a region with the alloy projections 114 as main components coexist in the surface of the lower electrode 106, the region with TiN as a main component can be exposed to the via hole bottom so that the via and TiN are connected, with the result that a rise in resistance values can be prevented.

Exemplary Embodiment

FIG. 3 is a drawing showing a state of the surface of the lower electrode 106 manufactured in the procedure for manufacturing the semiconductor device described with reference to FIGS. 1 and 2. In the drawing, white portions show regions in which the alloy projections 114 are formed. As shown in the drawing, the alloy projections 114 are formed in the grain boundary 108 formed in a mesh shape. The ratio of the alloy projections 114 to the surface area of the lower electrode 106 was 23%.

Hereinbefore, embodiments of the present invention have been described with reference to the drawings. These embodiments are examples of the present invention, and various constructions other than the above may be adopted.

For example, the dense films 116 may be formed by irradiating gases containing nitrogen or oxygen onto the alloy projections 114 as pre-processing of a process of forming the capacitor film 118, for example, after forming the alloy projections 114 in an island shape.

Further, it is noted that, Applicant's intent is to encompass equivalents of all claim elements, even if amended later during prosecution.

What is claimed is:

1. A method of forming a semiconductor device, comprising:
    forming a lower electrode including a metal and a nitrogen, on a semiconductor substrate;
    irradiating a reducing gas to a surface of the lower electrode;
    irradiating a gas containing silicon to the surface of the lower electrode to form a projection containing silicide, by reacting said metal with said silicon in an island shape on the surface of the lower electrode;
    forming a capacitor film on the lower electrode and the projection; and
    forming an upper electrode on the capacitor film.

2. The method according to claim 1, wherein the projection is formed in a region in which the metal is unreacted with said nitrogen.

3. The method according to claim 1, wherein the projection is formed at a grain boundary of the surface of the lower electrode.

4. The method according to claim 1, wherein said forming the projection comprises:
    irradiating said gas containing silicon to the surface of the lower electrode to form silicon-containing crystal grains in said island shape on the surface of the lower electrode; and
    reacting the silicon-containing crystal grains with the metal by thermal processing to thereby form the projection.

5. The method according to claim 1, further comprising: after forming the projection,
    irradiating a gas containing nitrogen or oxygen onto the projection; and
    reacting silicon contained in the projection and the nitrogen or oxygen to form a silicon nitride film or a silicon oxide film on a surface of the projection.

6. The method according to claim 1, wherein the capacitor film is formed by a gas containing nitrogen or oxygen, and at a same time, a reaction is caused between Si contained in the projection and the nitrogen or oxygen, to form a nitride film containing silicon or an oxide film containing silicon on a surface of the projection.

7. The method according to claim 1, wherein the metal includes Ti, the lower electrode is formed with TiN as a main component, and the projection is formed by an alloy containing Ti and Si.

8. A method of forming a semiconductor device, comprising:

forming a lower electrode including a metal and a nitrogen, on a semiconductor substrate to include a plurality of regions in which the metal is unreacted with said nitrogen on a surface of said lower electrode;

irradiating a gas containing silicon to the surface of the lower electrode to react the unreacted metal with said gas in order to form a plurality of projections containing silicide on said regions of the surface of the lower electrode;

forming a capacitor film on the lower electrode and the projection; and forming an upper electrode on the capacitor film.

9. The method as claimed in claim 8, wherein said plurality of regions are at a portion where a grain boundary of said lower electrode exists.

10. The method as claimed in claim 9, wherein a proportion of an area of the unreacted metal to an area of all of a top surface of said lower electrode is within a range of substantially 5% to substantially 30%.

11. The method as claimed in claim 9, further comprising irradiating a reducing gas to the surface of the lower electrode to remove an oxide on the unreacted metal before irradiating said gas containing silicon.

* * * * *